US011067899B1

(12) United States Patent
Ghosh

(10) Patent No.: US 11,067,899 B1
(45) Date of Patent: Jul. 20, 2021

(54) SCATTERING LITHOGRAPHY

(71) Applicant: Vathys, Inc., Portland, OR (US)

(72) Inventor: Tapabrata Ghosh, Portland, OR (US)

(73) Assignee: Vathys, Inc., Portland, OR (US)

( * ) Notice: Subject to any disclaimer, the term of this patent is extended or adjusted under 35 U.S.C. 154(b) by 0 days.

(21) Appl. No.: 16/780,515

(22) Filed: Feb. 3, 2020

(51) Int. Cl.
*G03B 27/68* (2006.01)
*G03F 7/20* (2006.01)
(52) U.S. Cl.
CPC ................ *G03F 7/70208* (2013.01)
(58) Field of Classification Search
CPC ............ G03F 7/70208; G03F 7/70308; G03F 7/70191
See application file for complete search history.

(56) References Cited

U.S. PATENT DOCUMENTS

| 6,245,470 | B1 * | 6/2001 | Kamon | G02B 27/0025 |
| | | | | 250/201.2 |
| 2012/0264066 | A1 * | 10/2012 | Chen | G03F 7/70275 |
| | | | | 430/322 |
| 2019/0324375 | A1 * | 10/2019 | Peijster | H01J 37/28 |

OTHER PUBLICATIONS

Park et al. "Disordered Optics: Exploiting Multiple Light Scattering and Wavefront Shaping for Nonconventional Optical Elements", Sep. 2019.*

Zeloof, "Maskless Photolithography", 2018, http://sam.zeloof.xyz/maskless-photolithography/, Retrieved Jan. 29, 2020.
Zhuang et al., High focusing efficiency in subdiffraction focusing metalens, Jun. 22, 2019, Nanophotonics, vol. 8, Issue 7; https://www.degruyter.com/view/j/nanoph.2019.8.issue-7/nanoph-2019-0115/nanoph-2019-0115.xml, Retrieved Jan. 29, 2020.
Li et al., "Feasibility of resonant metalens for the subwavelength imaging using a single sensor in the far field", Jul. 25, 2014, Optics Express, https://www.osapublishing.org/DirectPDFAccess/831F2E08-9B8AAA6E-22877D2B1D7BE138_297209/oe-22-15-18688.pdf?da=1&id=297209&seq=0&mobile=no, Retrieved Jan. 29, 2020.
Lemoult et al., "Resonant Metalenses for Breaking the Diffraction Barrier", Apr. 14, 2010, physics.optics, https://arxiv.org/pdf/1006.0799.pdf, Retrieved Jan. 29, 2020.
Lemoult et al., "A polychromatic approach to far-field superlensing at visible wavelengths", Jun. 6, 2012, Nature, https://www.nature.com/articles/ncomms188, Retrieved Jan. 29, 2020.
Maznev et al., "Upholding the diffraction limit in the focusing of light and sound", Feb. 25, 2016, Wave Motion 68, 182-189, https://arxiv.org/abs/1602.07958, Retrieved Jan. 29, 2020.

(Continued)

*Primary Examiner* — Peter B Kim
(74) *Attorney, Agent, or Firm* — Cognition IP, P.C.; Edward Steakley

(57) ABSTRACT

Disclosed are systems and methods for achieving sub-diffraction limit resolutions for fabrication of integrated circuits. In one embodiment, a photolithography system is disclosed. The system includes a light source, configured to emit laser beams; a reflector configured to receive the laser beams and focus the laser beams on a condensing lens; a scattering medium, configured to receive the laser beams and generate scattered laser beams; and a wave-front shaping module, configured to receive the scattered laser beams and generate a focused laser beam on a silicon wafer.

18 Claims, 3 Drawing Sheets

(56) References Cited

OTHER PUBLICATIONS

Vellekoop et al., "Exploiting disorder for perfect focusing", Oct. 5, 2009, Nature Photonics, https://arxiv.org/abs/0910.0873. Retrieved Jan. 29, 2020.
Choi et al., "Overcoming the Diffraction Limit Using Multiple Light Scattering in a Highly Disordered Medium", Jul. 6, 2011, NCBI, https://www.ncbi.nlm.nih.gov/pmc/articles/PMC3345286/, Retrieved Jan. 29, 2020.

* cited by examiner

SCATTERING LITHOGRAPHY

BACKGROUND

Field

This invention relates generally to the field of photolithography, and more particularly to high-resolution photolithography techniques for manufacturing integrated circuits.

Description of the Related Art

Modern electronics have benefitted immensely from shrinking integrated circuit (IC) sizes and more transistors per unit of area. Shrinking transistor sizes and more computing power per unit of area have approximately followed industry predictions, such as those made according to Moore's law. Underlying this advancement has been the ability to fabricate smaller transistors per unit of area using advanced photolithography techniques. However, recently, advancements in fabrication technology and photolithography using conventional optical instruments are reaching their physical limits. Consequently, if further advancements in shrinking transistor sizes and fabrication of more dense computing systems are desired, there is a need for more advanced fabrication techniques that can overcome limitations presented by conventional photolithography instruments.

SUMMARY

In one aspect, a photolithography system is disclosed. The system includes: a light source, configured to emit laser beams; a reflector configured to receive the laser beams and focus the laser beams on a condensing lens; a scattering medium, configured to receive the laser beams and generate scattered laser beams; and a wave-front shaping module, configured to receive the scattered laser beams and generate a focused laser beam on a silicon wafer.

In one embodiment, the reflector comprises a digital mirror device, configured to reflect laser beams based at least partly on an input image, comprising an integrated circuit pattern for direct writing on the silicon wafer.

In some embodiments, the wave-front shaping module further includes: a photolithography mask, comprising integrated circuit patterns for fabrication on the silicon wafer; and a distortion compensation pattern configured to receive the scattered laser beams and generate a focused laser beam on the silicon wafer, based at least partly on the integrated circuit pattern.

In another embodiment, the system, further includes a photolithography mask, comprising integrated circuit patterns for fabrication on the silicon wafer.

In another embodiment, the wave-front shaping module comprises one or more of a holographic mask, a normal mask, a digital micrometer device, and a spatial light modulator.

In one embodiment, the wave-front shaping module includes an array of phase-modulated segments, whose positions and phase can be adjusted with a learning feedback algorithm to generate the focused laser beam on the silicon wafer.

In some embodiments, the system further includes a processor configured to: generate a transmission matrix based on input/output response of the scattering medium; determine a correlation between the transmission matrix and the scrambled laser beams; and based on the correlation configure the wave-front shaping module to receive the scattered laser beams and generate a focused laser beam on the silicon wafer.

In another embodiment, the wave-front shaping module is configured to receive the scattered laser beams and generate a focused laser beam based on approximation by a linear distortion matrix, in frequency, spatial or basis domains.

In one embodiment, the light source is replaced with a charged particle generator generating a beam of charged particles in lieu of laser beams, wherein the charged particles pass through the scattering medium and the wave-front shaping module providing a beam with focused with sub-diffraction limit resolution on the silicon wafer.

In another aspect, a method of photolithography is disclosed. The method includes: emitting laser beams from a light source; reflecting the laser beams by a reflector; receiving the laser beams by a condensing lens; scattering the laser beams by a scattering medium, generating scattered laser beams; and receiving the scattered laser beams by a wave-front shaping module and generating a focused laser beam on a silicon wafer.

In one embodiment, the reflector includes a digital mirror device, configured to reflect laser beams based at least partly on an input image, comprising an integrated circuit pattern for direct writing on the silicon wafer.

In some embodiments, the wave-front shaping module further includes: a photolithography mask, comprising integrated circuit patterns for fabrication on the silicon wafer; and a distortion compensation pattern configured to receive the scattered laser beams and generate a focused laser beam on the silicon wafer, based at least partly on the integrated circuit pattern.

In another embodiment, the method further includes providing a photolithography mask, comprising integrated circuit patterns for fabrication on the silicon wafer.

In another embodiment, the wave-front shaping module includes one or more of a holographic mask, a normal mask, a digital micrometer device, and a spatial light modulator.

In one embodiment, the wave-front shaping module includes an array of phase-modulated segments, whose positions and phase can be adjusted with a learning feedback algorithm to generate the focused laser beam on the silicon wafer.

In one embodiment, a processor is configured to: generate a transmission matrix based on input/output response of the scattering medium; determine a correlation between the transmission matrix and the scrambled laser beams; and based on the correlation configure the wave-front shaping module to receive the scattered laser beams and generate a focused laser beam on the silicon wafer.

In one embodiment, the wave-front shaping module is configured to receive the scattered laser beams and generate a focused laser beam based on approximation by a linear distortion matrix, in frequency, spatial or basis domains.

In some embodiments, the light source is replaced with a charged particle generator generating a beam of charged particles in lieu of laser beams, wherein the charged particles pass through the scattering medium and the wave-front shaping module providing a beam with focused with sub-diffraction limit resolution on the silicon wafer.

In another aspect a photolithography system is disclosed. The system includes: means for emitting laser beams from a light source; means for reflecting the laser beams by a reflector; means for receiving the laser beams by a condensing lens; means for scattering the laser beams by a scattering medium, generating scattered laser beams; and means for receiving the scattered laser beams by a scattering medium and generating a focused laser beam on a silicon wafer.

In some embodiments, the wave-front shaping module further includes: a photolithography mask, comprising integrated circuit patterns for fabrication on the silicon wafer; and a distortion compensation pattern configured to receive the scattered laser beams and generate a focused laser beam on the silicon wafer, based at least partly on the integrated circuit pattern.

BRIEF DESCRIPTION OF THE DRAWINGS

These drawings and the associated description herein are provided to illustrate specific embodiments of the invention and are not intended to be limiting.

DETAILED DESCRIPTION

Figure 1A:
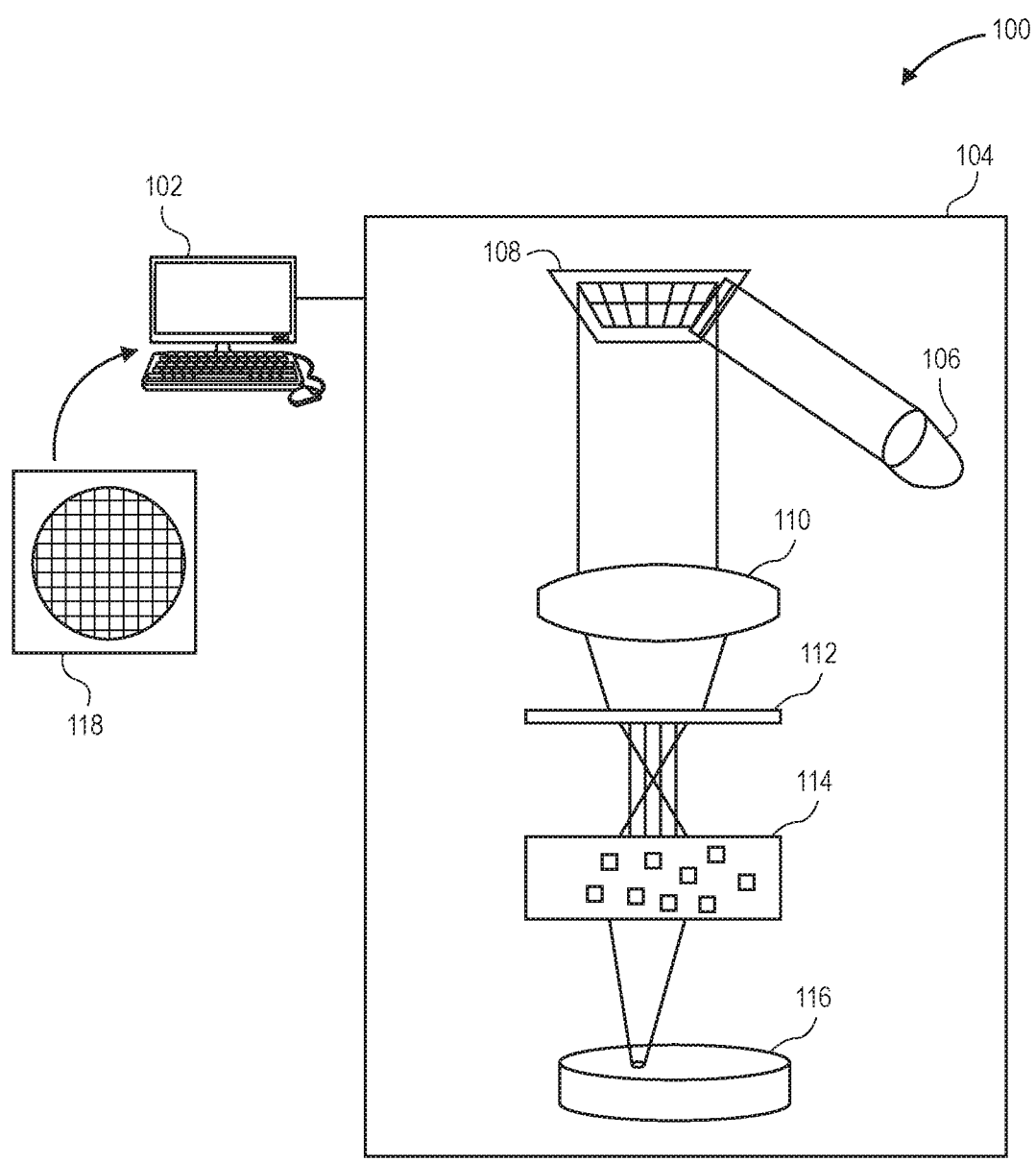
FIG. 1A illustrates a scattering photolithography system, which can be utilized in combination with a direct writing technique to fabricate integrated circuits on a silicon wafer with a resolution higher than diffraction-limited systems.

The following detailed description of certain embodiments presents various descriptions of specific embodiments of the invention. However, the invention can be embodied in a multitude of different ways as defined and covered by the claims. In this description, reference is made to the drawings where like reference numerals may indicate identical or functionally similar elements.

Unless defined otherwise, all terms used herein have the same meaning as are commonly understood by one of skill in the art to which this invention belongs. All patents, patent applications and publications referred to throughout the disclosure herein are incorporated by reference in their entirety. In the event that there is a plurality of definitions for a term herein, those in this section prevail. When the terms "one", "a" or "an" are used in the disclosure, they mean "at least one" or "one or more", unless otherwise indicated.

Definitions

The term "evanescent wave" refers to an oscillating electric and/or magnetic field that does not propagate as an electromagnetic wave but whose energy is spatially concentrated in the vicinity of the source (oscillating charges and currents).

The term "subwavelength" is used to describe an object having one or more dimensions smaller than the length of the wave with which the object interacts.

Need for Improved Photolithography Techniques

Integrated circuits present a tour de force of technological accomplishments and underpin modern computing systems. The success of integrated circuits to a large degree has been driven by the successful application of the Moore's Law, which states in part that, the number of transistors in an integrated circuit roughly doubles every two years. An enormous amount of progress in the integration of more and more components (e.g., transistors) on an integrated circuit has been achieved and the Moore's Law has held true over the past few decades. Advanced techniques in photolithography, which are used to define and fabricate miniaturized features and patterns, have been critical to the continued success of integrated circuits.

The industry-dominant method of using photolithography has been to use a light source and a photomask, where the photomask is exposed with the light source (sometimes with multiple exposures) to pattern integrated circuit features and designs onto a photoresist material deposited on a silicon substrate. The patterns, features and designs on the photomask are replicated on the photoresist material. In other words, the photoresist material is used to transfer patterns, features and designs onto the silicon substrate by various methods including etching or other fabrication techniques.

Photolithography using a light source can be limited in the maximum achievable resolution by the Rayleigh's criterion for diffraction-limited systems, given by Equation 1.

$$R = 1.22 \frac{\lambda f}{d} = k1 \frac{\lambda}{NA} \qquad \text{Equation 1}$$

In Equation 1, "R" is the spatial resolution of a photolithography system, "λ" is the wavelength of the light source used in the system, f is the focal length of the lens used to focus the light source, "d" refers to the diameter of the light beam emitted by the light source, "NA," or "numerical aperture," refers to the range of angles over which a photolithography system can accept or emit light, and "k1" refers to an experimental parameter, which can be determined in a photolithography system to relate the spatial resolution "R" with wavelength "λ" and numerical aperture "NA".

The smaller the spatial resolution, R, the higher resolution a photolithography system can achieve. To shrink transistor feature sizes even further, scaling the k1 factor and the numerical aperture has yielded better resolution, but those techniques are reaching their limits, as integrated circuits continue to shrink in size. Another technique called multiple patterning has been used in industry extensively to overcome low-resolution and other limitations of photolithography systems. These techniques, which have been deployed since the 28 nanometer (nm) process node, can increase fabrication cost, as the mask steps can increase exponentially and introduce overlay accuracy limitations.

To improve resolution, shorter wavelengths such as extreme ultraviolet (EUV) or X-ray can be used. However, photolithography systems using short wavelengths can suffer from some disadvantages. For example, the output power of these systems can be very low due to inefficient light generation sources at these wavelengths. While expensive, the optical system of mirrors and lenses at short wavelengths can be still inefficient, absorbing most of the light output of the light generation system. Shorter wavelengths can also present a challenge in the way of stochastics and shot noise, as the energy carried by each photon at these wavelengths can be very high, so even a few less photons arriving at a target, can cause deleterious effects in the resulting photolithography process. Furthermore, the interactions between photoresist chemistry and light at short wavelengths can be inefficient, and in some cases, poorly understood. Finally, there are a number of other issues with using shorter wavelength light sources in photolithography, such as lack of suitable pellicles, cooling challenges in a vacuum environment, machine costs, and other issues.

In one respect, the diffraction limit in photolithography systems stems from the problem that is presented when sub-wavelength information would have to propagate with a phase velocity faster than that of light in order to circumvent the Rayleigh criterion. As a result, these systems are diffraction limited. On the other hand, objects and light sources, being finite in size, they can propagate sub-wavelength information in the form of evanescent waves. In practice, the evanescent waves can decay in strength exponentially, as they move away from an object. Nonetheless, since they can convey sub-wavelength information, evanescent waves can be good candidates in photolithography systems for achieving better resolutions than diffraction limited systems would otherwise allow. In other words, Rayleigh's criterion can be circumvented if subwavelength information can be patterned on a mask or directly written into a photoresist material, thereby achieving resolutions better than those offered by diffraction limited photolithography systems.

Some existing techniques in photolithography can use evanescent waves, but only by operating in the near-field proximity of an object. In these techniques, near-field operation can be due to losses in superlenses used in these techniques, along with the natural decay in the strength of the evanescent waves as one moves away from an object. However, having to operate photolithography equipment in the near-field of a photomask or photoresist material, as some existing techniques require, can introduce challenges. For example, in some near-field techniques the tip of a probe is placed within a wavelength distance of a sample. This can introduce technical challenges and complications, which can limit the use of evanescent waves in photolithography.

One method to convert weak evanescent waves into propagating waves is to use resonant metalenses. Using resonant effects arising from sub-wavelength spacing in resonant metalenses, evanescent waves can be converted to propagating waves. In the microwave regime, this technique can achieve focusing as much as $\lambda/25$ and imaging as small as $\lambda/80$, which are well-beyond the conventional diffraction limit. While resonant metalenses can be built to handle optical frequencies, they are more difficult to manufacture since small process and manufacture variations can destroy the capability of the resonant metalenses to deterministically focus.

Other sub-diffraction limit photolithography techniques can include photonic nanojets, near-field plasmonic-based techniques and super-oscillations. However, these techniques also can suffer from the requirement to act in the near-field regime and/or produce low power outputs that can become challenging to use in photolithography.

A phenomenon that can occur when subwavelength light sources are used in photolithography, is subwavelength scattering. Disordered subwavelength scattering can be used to improve the resolution of photolithography systems. In one respect, a resonant metalens can be interpreted as a medium in which the resonance wavelength is less than that of the light. Subwavelength scattering can be considered a disordered resonant metalens, which can be used for the conversion of evanescent waves to propagating waves. In other words, a disorder function $F(x)$ can be defined as Equation 2.

$$F(\text{resonant\_metalens}) = \text{scattering\_medium} \qquad \text{Equation 2}$$

Therefore, inversion of the disorder function $F(x)$, can recover a resonant metalens focusing, without the need for complex fabrication of an ideal or perfect resonant metalens. In practice, $F(x)$ can be well approximated by a single, linear distortion matrix in either the frequency, spatial or basis domains. The disorder function $F(x)$ or its inverse can also be approximated by a tensor and/or nonlinear analysis. Additionally, the distortion function $F(x)$ or its inverse (e.g., in the form of a matrix and/or tensor parameters) can be in whole or in part generated and/or learned via machine learning algorithms and techniques and/or learned using stochastic search (e.g., by Metropolis-Hastings). This can enable very low-cost and simple scattering media (e.g., white paint) to be used, in order to recover a resonant metalens focusing. The described embodiments can utilize a scattering medium to act as a disordered resonant metalens which can convert evanescent waves into propagating waves and therefore can achieve sub-diffraction limit focusing and resolution. For example, in some embodiments, a scattering medium is used to scatter light and one or more wave-front shaping modules are used to compensate for the scattering effect and to achieve sub-diffraction limit resolution. Example wave-front modules, which can be used, include holographic mask, a normal mask, a digital micromirror device, a spatial light modulator, and others. Additionally, in some embodiments, the described systems and methods can be deployed with direct writing and mask-based writing techniques.

Direct Writing

FIG. 1A illustrates a scattering photolithography system 100, which can be utilized in combination with a direct writing technique to fabricate integrated circuits on a silicon wafer with a resolution higher than diffraction-limited systems. The system 100 includes a computer 102 for managing the operations of the scattering photolithography system 100. The computer 102 can include components, such as processor, long term storage, such as hard disk drive (HDD), short term memory, such as random-access-memory (RAM), input/output (I/O) devices and wireless or wired communication interfaces to connect with and manage the operations of the components of the scattering photolithography system 100. In one embodiment, the system 100 includes a photolithography chamber 104, which can house the components of the system 100 and provide electrical or mechanical interfaces to the computer 102 for managing the operations of the various components therein. A light source 106 can generate light of wavelengths that are appropriate for photolithography. In some embodiments, an example light source 106 can be a laser generator, such as an excimer laser, but other laser sources and wavelengths can also be used.

The system 100 can also include a digital mirror device (DMD) 108 which can reflect the light emitted from light source 106 onto a condensing lens 110. In some embodiments, the DMD 108 can receive image data 118 containing a pattern of ICs to be fabricated on a silicon wafer 116 and reflect light according to the image data 118 and the pattern of ICs to be fabricated. The condensing lens 110 focuses the light onto a scattering medium 112. The scattering medium 112 can be any non-transparent scattering object with a disordered internal structure. The disordered internal structure of the scattering medium 112 randomizes the direction and position of the received light rays as they travel through the scattering medium 112. In one respect, the scattering medium 112 allows focusing of light on an object that is outside a conventional lens's field of focus. In some embodiments, a surface painted with white paint can be used as the scattering medium 112.

The scattered light rays are received by a wave-front shaping module 114, which can be configured to compensate for the disordered light rays and output light rays with recovered focus. The recovered focus can be a sub-diffraction limit focus. The wave-front shaping module 114 can be a spatial light modulator, which can shape the wave-front of the light that impinges on the condensing lens 110. The surface area of the light modulator can include an array of segments (e.g., square or circular in shape), which can be phase-modulated and controlled by a learning feedback algorithm. The algorithm can adjust the relative phases of the segments and/or their positions so that the transmitted light through the wave-front shaping module 114 can interfere constructively in a chosen target on the silicon wafer 116, thereby creating a focus at a desired location on the silicon wafer 116. The focus can be a sub-diffraction limit focus with high resolution. The wave-front shaping module 114 can be deployed using a variety of mechanisms, such as a holographic mask, a digital micromirror device, a spatial light modulator, or any other mechanism to compensate for the scattering effect and to achieve sub-diffraction limit resolution.

An advantage of the described systems and methods in combination with direct writing mechanism is that it they are mask-less, thereby removing the need for expensive and fragile masks, as well as improving flexibility and spin time. In comparison to electron-beam lithography, the laser beams used in the system 100 have no intrinsic electrical charge. Therefore, multiple beams can be used simultaneously, or multiple beams can be added, without introducing the complexity of Coulomb interactions.

Figure 1B:
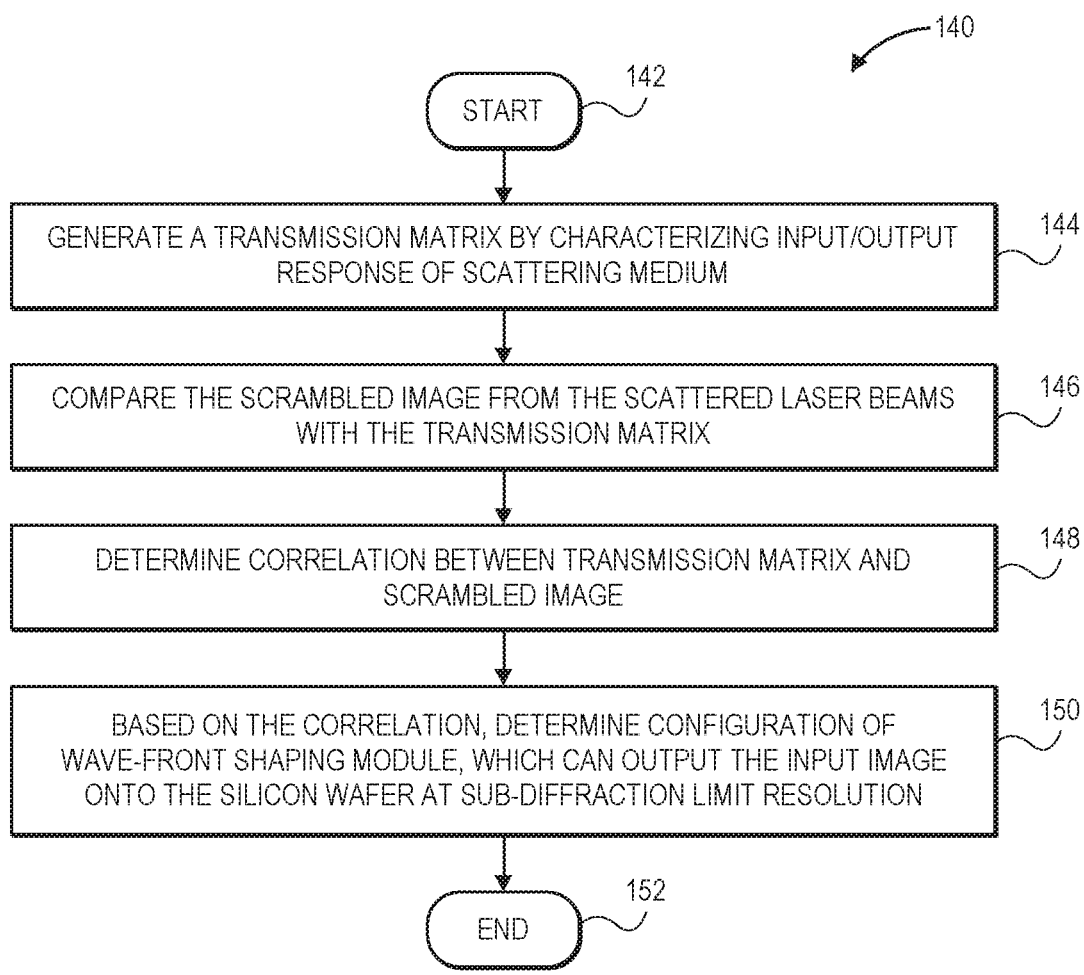
FIG. 1B illustrates a method of configuring a wave-front shaping module to use the scattered laser beams outputted from the scattering medium in order to focus a beam of light on the silicon wafer with sub-diffraction limit focusing and a high resolution.

FIG. 1B illustrates a method 140 of configuring the wave-front shaping module 114 to use the scattered laser beams outputted from the scattering medium 112 in order to focus a beam of light on the silicon wafer 116 with sub-diffraction limit focusing and a high resolution. The method starts at the step 142. At step 144, a transmission matrix is generated by characterizing an input/output response of the scattering medium, relative to the input images 118. In one embodiment, the scattering medium 112 can be illuminated with a laser beam and output images from the output of the scattering medium 112 can be recorded. At step 146, the scattered output images can be compared against the transmission matrix. At step 148, a correlation between the transmission output matrix and the scrambled images can be determined. At step 150, based on the determined correlation, a configuration of the wave-front shaping module 114 can be determined. The configuration of the wave-front shaping module 114 can position the wave-front shaping module 114 to receive scattered laser beams outputted from the scattering medium 112 and output a sub-diffraction-limit focused beam on the silicon wafer 116. The method ends at step 152. In embodiments, where the wave-front shaping module 114 is implemented with a light modulator, surface areas of phase-modulated, segments can be positioned and repositioned based on a feedback learning algorithm that adjusts the positioning and/or the phase of the segments until the wave-front shaping module 114 can focus the input image 118 on the surface of the silicon wafer 116 at desired resolution. As described earlier, the focus can be at a resolution higher than resolutions achieved by diffraction-limited systems.

Mask-Based Writing

Figure 2:
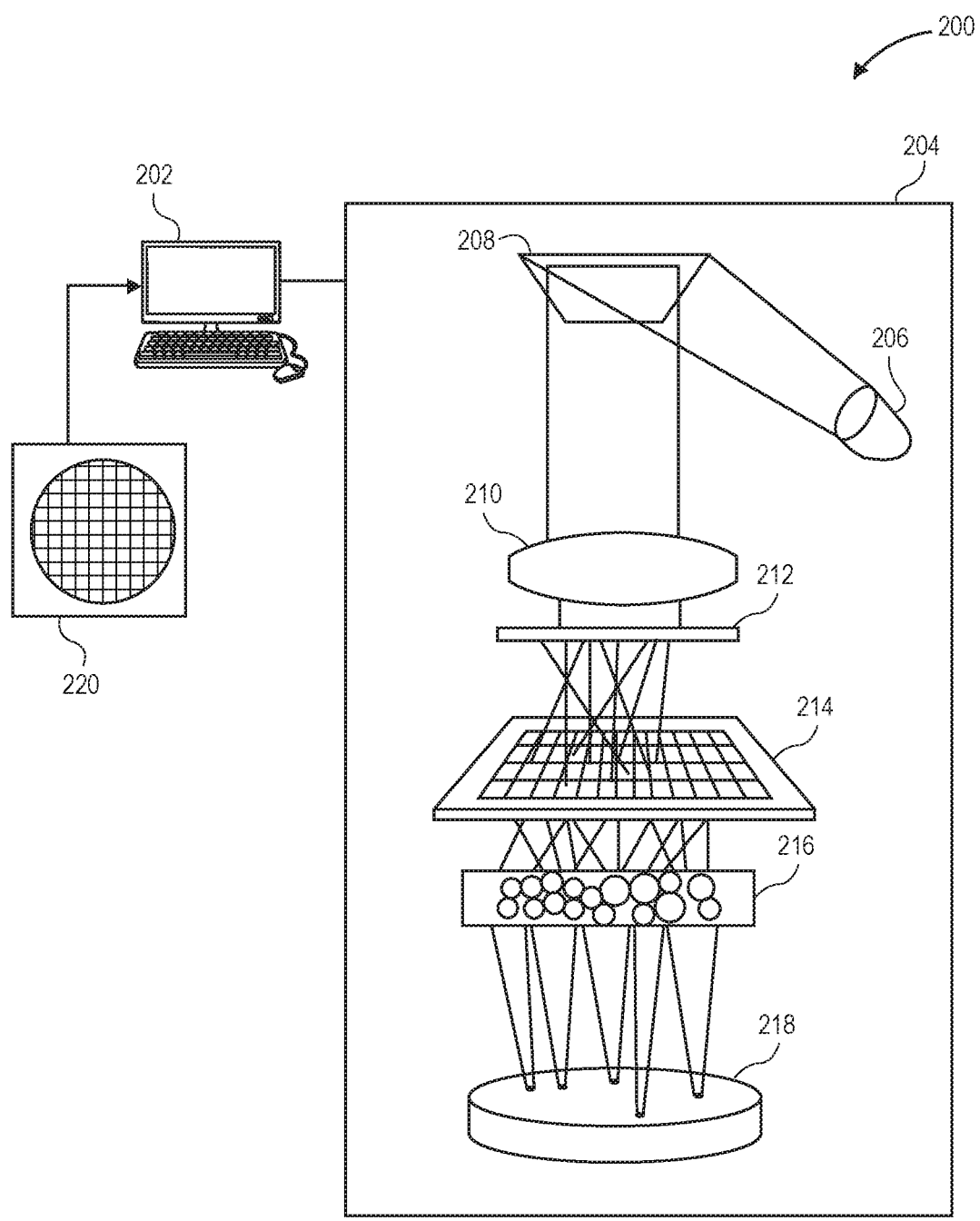
FIG. 2 illustrates a scattering photolithography system, which can be utilized in combination with mask-based writing techniques to fabricate integrated circuits on a silicon wafer with a resolution higher than diffraction-limited systems.

FIG. 2 illustrates a scattering photolithography system 200, which can be utilized in combination with mask-based writing techniques to fabricate integrated circuits on a silicon wafer with a resolution higher than diffraction-limited systems. While direct writing offers advantages, it can be too slow for some industrial applications, where printing multiple copies of IC patterns on silicon wafers may be desirable. System 200 utilizes a mask to facilitate faster and larger IC printing for industrial applications, while maintaining the sub-diffraction-limit resolution. A computer 202 is similar in configuration to the computer 102 as described above and can manage the operations of the system 200. It can store or receive an IC pattern input image 220, which the system 200 can pattern on a silicon wafer 218.

The system 200 can utilize a chamber 204 for housing the components of the system 200. The system 200 can include a light source 206, which can be similar in design and operation to the light source 106, as described earlier. The light source 206 can send one or more light beams to reflector(s) 208. The reflector(s) 208 reflect the light onto a condensing lens 210. The condensing lens 210 can be similar in operation and design to the condensing lens 110. The light received from the condensing lens 210 can be incident upon a scattering medium 212, with similar properties as described earlier in relation to the scattering medium 112. In one embodiment, a reticle or mask 214 can be constructed based on the input image 220 and receive the scattered light outputted from the scattering medium 212. In one embodiment, the mask 214 can include a compensation pattern, such that the scattered light incident upon the mask 214 can be focused on the silicon wafer 218. The resolution of the focus achieved in this manner can be beyond the resolution achievable by diffraction-limited photolithography systems. The compensation pattern can be determined according to the techniques described above in relation to the embodiment of FIG. 1B, and/or by using a feedback learning mechanism to tune the compensation pattern in mask 214 to achieve sub-diffraction-limit resolution on the silicon wafer 218.

In one embodiment, in lieu of or in addition to a compensation pattern embedded in the mask 214, a wave-front-shaping module 216 can be used. The wave-front shaping module 216 can be similar in operation and design to the properties of the wave-front shaping module 114. The wave-front shaping module 216 can be configured using techniques similar to those described above in relation to the embodiment of FIG. 1B, by a learning feedback algorithm, or by a linear approximation of a distortion matrix in either frequency, spatial or basis domains.

Although photolithography using light beams will likely dominate the future of lithography for the purpose of fabricating ICs, the described embodiments can also be applied to other types of lithography, such as charged particle beams lithography, electron beam lithography and/or focused ion beam lithography. Charged particle beam scattering can be in some ways, even easier to induce than that of light, and by using the described embodiments. Charged particles can act as components analogues to optical components. For example, spatial charged particle modulators can be used to provide sub-nanometer or sub-picometer lithographic resolution. Therefore, the described embodiments can be used to build sub-picometer lithographic systems, as there is currently no sub-picometer resonant metalenses for charged particles.

The described embodiments offer several advantages. They enable immediate realization of resolutions 5-10× greater than what is currently achievable at a given wavelength, but for a lower cost. For example, even white paint can be used as the scattering medium. Similarly, wave-front shaping module is relatively inexpensive to build and use. On the other hand, current proposals for next generation lithography require substantial investment and expenditure by the industry and only promise or can achieve 2-4× greater resolution than what is otherwise available. The described systems and methods, on the other hand, in principle, have no resolution limit. Better-quality distortion compensation mechanisms and deeper subwavelength scattering structures can be used in order to achieve even greater resolutions. Just as radically, the described techniques can extend the capability of extremely low cost lithography tools such as do-it-yourself (DIY) and simple setups to achieve lithography competitive or even better than high-cost commercial tools like 193 nm immersion steppers, enabling decentralization and greatly reduced capex of advanced node semiconductor manufacturing. Finally, the described techniques are orthogonal to several other lithography enhancement techniques and can work in combination with those.

While the embodiments are described in relation to fabricating an integrated circuit on the silicon wafers 116 and 218, the applications of the described systems and methods are not so limited and can be applied for fabrication on any free-standing structure. For example, fabrication on any structure capable of deposition of photoresist material can use the described systems and methods.

What is claimed is:

1. A photolithography system comprising:
    a light source configured to emit one or more laser beams "laser beams");
    a reflector configured to receive the laser beams from the light source and focus the received laser beams on a condensing lens;
    a scattering medium configured to receive the focused laser beams and generate scattered laser beams;
    a processor configured to:
        generate a transmission matrix based on an input/output response of the scattering medium;
        determine a correlation between the transmission matrix and the scattered laser beams; and
        based on the correlation, configure a wave-front shaping module to receive the scattered laser beams and generate a focused laser beam on a silicon wafer.
2. The system of claim 1, wherein the reflector comprises a digital mirror device, configured to reflect laser beams based at least partly on an input image, comprising an integrated circuit pattern for direct writing on the silicon wafer.
3. The system of claim, 1, wherein the wave-front shaping module further comprises:
    a photolithography mask, comprising integrated circuit patterns for fabrication on the silicon wafer; and
    a distortion compensation pattern configured to receive the scattered laser beams and generate a focused laser beam on the silicon wafer, based at least partly on the integrated circuit pattern.
4. The system of claim 1, further comprising a photolithography mask, comprising integrated circuit patterns for fabrication on the silicon wafer.
5. The system of claim 1, wherein the wave-front shaping module comprises one or more of a holographic mask, a normal mask, a digital micromirror device, and a spatial light modulator.
6. The system of claim 1, wherein the wave-front shaping module comprises an array of phase-modulated segments, whose positions and phase can be adjusted with a learning feedback algorithm to generate the focused laser beam on the silicon wafer.
7. The system of claim 1, wherein the wave-front shaping module is configured to receive the scattered laser beams and generate a focused laser beam based on approximation by a linear distortion matrix, in frequency, spatial or basis domains.
8. The system of claim 1, wherein the light source is replaced with a charged particle generator generating a beam of charged particles in lieu of laser beams, wherein the charged particles pass through the scattering medium and the wave-front shaping module providing a beam with focused with sub-diffraction limit resolution on the silicon wafer.
9. A method of photolithography comprising:
    emitting one or more laser beams ("laser beams") from a light source;
    reflecting, by a reflector, the laser beams emitted from the light source;
    receiving the reflected laser beams by a condensing lens;
    generating scattered laser beams by scattering the reflected laser beams by a scattering medium,
    generating a transmission matrix based on an input/output response of the scattering medium;
    determining a correlation between the transmission matrix and the scattered laser beams; and
    based on the correlation, configuring a wave-front shaping module to receive the scattered laser beams and generate a focused laser beam on a silicon wafer.
10. The method of claim 9, wherein the reflector comprises a digital mirror device, configured to reflect laser beams based at least partly on an input image, comprising an integrated circuit pattern for direct writing on the silicon wafer.
11. The method of claim, 9, wherein the wave-front shaping module further comprises:
    a photolithography mask, comprising integrated circuit patterns for fabrication on the silicon wafer; and
    a distortion compensation pattern configured to receive the scattered laser beams and generate a focused laser beam on the silicon wafer, based at least partly on the integrated circuit pattern.
12. The method of claim 9, further comprising providing a photolithography mask, comprising integrated circuit patterns for fabrication on the silicon wafer.
13. The method of claim 9, wherein the wave-front shaping module comprises one or more of a holographic mask, a normal mask, a digital micromirror device, and a spatial light modulator.
14. The method of claim 9, wherein the wave-front shaping module comprises an array of phase-modulated segments, whose positions and phase can be adjusted with a learning feedback algorithm to generate the focused laser beam on the silicon wafer.
15. The method of claim 9, wherein the wave-front shaping module is configured to receive the scattered laser beams and generate a focused laser beam based on approximation by a linear distortion matrix, in frequency, spatial or basis domains.
16. The method of claim 9, wherein the light source is replaced with a charged particle generator generating a beam of charged particles in lieu of laser beams, wherein the charged particles pass through the scattering medium and the wave-front shaping module providing a beam with focused with sub-diffraction limit resolution on the silicon wafer.
17. A photolithography system, comprising:
    a light source configured to emit one or more laser beams ("laser beams");

a reflector configured to receive the laser beams from the light source and focus the received laser beams on a condensing lens;

a scattering medium configured to receive the focused laser beams and generate scattered laser beams;

a wave-front shaping module configured to receive the scattered laser beams and generate a focused laser beam on a silicon wafer, wherein the wave-front shaping module is further configured to receive the scattered laser beams and generate the focused laser beam based on approximation by a linear distortion matrix in one of: a frequency domain, a spatial domain and a basis domain.

18. The system of claim 17, wherein the wave-front shaping module further comprises:

a photolithography mask comprising one or more integrated circuit patterns for fabrication on the silicon wafer; and a distortion compensation pattern configured to receive the scattered laser beams and generate the focused laser beam on the silicon wafer based at least in part on the one or more integrated circuit patterns.

* * * * *